US012336290B2

(12) United States Patent
Wang et al.

(10) Patent No.: US 12,336,290 B2
(45) Date of Patent: Jun. 17, 2025

(54) PIXEL CIRCUIT HAVING A DUAL GATE TRANSISTOR WITH VOLTAGE STABILIZATION AND, MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Mengqi Wang, Beijing (CN); Siyu Wang, Beijing (CN); Huijun Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/364,248

(22) Filed: Aug. 2, 2023

(65) Prior Publication Data

US 2023/0411411 A1    Dec. 21, 2023

Related U.S. Application Data

(63) Continuation of application No. 17/280,797, filed as application No. PCT/CN2020/099130 on Jun. 30, 2020, now abandoned.

(51) Int. Cl.
G09G 3/3225    (2016.01)
H10D 86/01    (2025.01)
(Continued)

(52) U.S. Cl.
CPC .......... H10D 86/60 (2025.01); G09G 3/3225 (2013.01); H10D 86/0221 (2025.01);
(Continued)

(58) Field of Classification Search
CPC ...................................................... H01L 27/12
See application file for complete search history.

(56) References Cited

U.S. PATENT DOCUMENTS

2015/0037916 A1\* 2/2015 Rohatgi ............... H10K 71/164
438/28
2015/0364075 A1\* 12/2015 Sato ..................... G09G 3/3233
345/698
(Continued)

FOREIGN PATENT DOCUMENTS

CN    108630143 A    10/2018
CN    109272930 A    1/2019
(Continued)

OTHER PUBLICATIONS

International Search Report and Written Opinion for PCT Application No. PCT/CN2020/099130, dated Mar. 18, 2021, 8 pages.
(Continued)

Primary Examiner — Sepehr Azari
(74) Attorney, Agent, or Firm — BROOKS KUSHMAN P.C.

(57) ABSTRACT

A display substrate, a manufacturing method thereof and a display device. The display substrate includes a base substrate and a plurality of subpixels arranged in an array form on the base substrate. Each subpixel includes a voltage stabilizing electrode, and a subpixel driving circuitry including a driving transistor, and a first transistor, a first electrode of which is coupled to a second electrode of the driving transistor, and a second electrode of which is coupled to a gate electrode of the driving transistor. An active layer of the first transistor includes a first semiconductor portion and a second semiconductor portion spaced apart from each other, and a conductor portion coupled to thereto. An orthogonal projection of the conductor portion onto the base substrate overlaps an orthogonal projection of voltage stabilizing
(Continued)

electrode of a previous subpixel in the first direction onto the base substrate. According to the present disclosure, it is able to improve the brightness uniformity of the subpixels of a display panel.

16 Claims, 8 Drawing Sheets

(51) Int. Cl.
  *H10D 86/40* (2025.01)
  *H10D 86/60* (2025.01)
  *H10K 59/122* (2023.01)
(52) U.S. Cl.
  CPC ... *H10D 86/481* (2025.01); *G09G 2300/0426* (2013.01); *G09G 2300/043* (2013.01); *G09G 2300/0452* (2013.01); *G09G 2300/0842* (2013.01); *G09G 2320/0233* (2013.01); *G09G 2330/02* (2013.01); *H10D 86/0251* (2025.01); *H10K 59/122* (2023.02)

(56) References Cited

U.S. PATENT DOCUMENTS

| | | | | |
|---|---|---|---|---|
| 2016/0043159 A1* | 2/2016 | Kim | ............... | H01L 27/124 257/71 |
| 2017/0025487 A1 | 1/2017 | Byun et al. | | |
| 2017/0287938 A1* | 10/2017 | Lee | ............... | H10K 77/111 |
| 2018/0122283 A1* | 5/2018 | Kim | ............... | G09G 3/2003 |
| 2018/0130409 A1* | 5/2018 | Xiang | ............... | G09G 3/3233 |
| 2018/0137818 A1* | 5/2018 | Kim | ............... | G09G 3/2003 |
| 2018/0151106 A1* | 5/2018 | Peng | ............... | G09G 3/3666 |
| 2018/0158417 A1* | 6/2018 | Xiang | ............... | G09G 3/3258 |
| 2018/0275806 A1 | 9/2018 | Yen et al. | | |
| 2019/0035875 A1* | 1/2019 | Xin | ............... | H01L 27/1255 |
| 2019/0312098 A1* | 10/2019 | Matsueda | ............ | H10K 59/353 |
| 2019/0392768 A1* | 12/2019 | Li | ............... | G09G 3/2014 |
| 2020/0168147 A1* | 5/2020 | Na | ............... | G09G 3/325 |
| 2020/0168686 A1 | 5/2020 | Han et al. | | |
| 2020/0357877 A1* | 11/2020 | Hyun | ............... | H10K 50/81 |
| 2021/0036083 A1* | 2/2021 | Hao | ............... | H10K 59/1216 |
| 2021/0134768 A1* | 5/2021 | Lee | ............... | H01L 25/167 |
| 2021/0335297 A1* | 10/2021 | Huangfu | ............ | G09G 3/2003 |
| 2021/0358420 A1* | 11/2021 | Yang | ............... | H01L 27/1255 |
| 2021/0407369 A1* | 12/2021 | Li | ............... | G09G 3/2074 |
| 2022/0302240 A1 | 9/2022 | Zhang et al. | | |

FOREIGN PATENT DOCUMENTS

| | | |
|---|---|---|
| CN | 110364552 A | 10/2019 |
| CN | 110767665 A | 2/2020 |
| CN | 110992880 A | 4/2020 |

OTHER PUBLICATIONS

First Office Action for Chinese Patent Application No. 202080001136.8, dated Mar. 20, 2023, 6 pages.
Non-final Rejection for U.S. Appl. No. 17/280,797, dated May 23, 2022, 20 pages.
Non-final Rejection for U.S. Appl. No. 17/280,797, dated Dec. 5, 2022, 21 pages.
Final Rejection for U.S. Appl. No. 17/280,797, dated Sep. 12, 2022, 19 pages.
Final Rejection for U.S. Appl. No. 17/280,797, dated May 5, 2023, 23 pages.

* cited by examiner

PIXEL CIRCUIT HAVING A DUAL GATE TRANSISTOR WITH VOLTAGE STABILIZATION AND, MANUFACTURING METHOD THEREOF

CROSS-REFERENCE TO RELATED APPLICATIONS

This application is a continuation of copending U.S. application Ser. No. 17/280,797, filed Mar. 26, 2021, which is the U.S. national phase of PCT Application No. PCT/CN2020/099130 filed on Jun. 30, 2020, which are incorporated herein by reference in their entireties.

TECHNICAL FIELD

The present disclosure relates to the field of display technology, in particular to a display substrate, a manufacturing method thereof and a display device.

BACKGROUND

With the mature of the Active-Matrix Organic Light-Emitting Diode (AMOLED) technology, the use of AMOLED in mobile terminals has become more and more popular. However, it is difficult to ensure brightness uniformity of subpixels of a display panel, and thereby a display effect of the display panel may be adversely affected.

SUMMARY

An object of the present disclosure is to provide a display substrate, a manufacturing method thereof and a display device, so as to ensure the brightness uniformity of the subpixels of the display panel.

In one aspect, the present disclosure provides in some embodiments a display substrate, including a base substrate and a plurality of subpixels arranged in an array form on the base substrate. The plurality of subpixels is arranged in rows, and each row of subpixels includes N subpixels arranged in sequence along a first direction, where N is a positive integer. Each subpixel includes a subpixel driving circuitry, the subpixel driving circuitry includes a driving transistor and a first transistor, a first electrode of the first transistor is coupled to a second electrode of the driving transistor, a second electrode of the first transistor is coupled to a gate electrode of the driving transistor, and an active layer of the first transistor includes a first semiconductor portion and a second semiconductor portion spaced apart from each other, and a conductor portion coupled to the first semiconductor portion and the second semiconductor portion. Each of first to $(N-1)^{th}$ subpixels in the first direction further includes a voltage stabilizing electrode. Each row of subpixels includes a plurality of first subpixels, the first subpixels of $N^{th}$ subpixels in the first direction are target subpixels, the target subpixel is arranged closest to a first boundary of the display substrate in the row of subpixels, and an orthogonal projection of the conductor portion of the first transistor of the target subpixel onto the base substrate overlaps an orthogonal projection of the voltage stabilizing electrode of the $(N-1)^{th}$ subpixel in the row onto the base substrate.

In a possible embodiment of the present disclosure, each subpixel further includes a power source signal line, at least a part of the power source signal line extends in a second direction, and the voltage stabilizing electrode is coupled to the power source signal line.

In a possible embodiment of the present disclosure, the voltage stabilizing electrode includes a first portion and a second portion coupled to each other, an orthogonal projection of the first portion onto the base substrate overlaps an orthogonal projection of the power source signal line onto the base substrate at an overlapping region where the first portion is coupled to the power source signal line, at least a part of the second portion extends along the first direction to a next subpixel in the first direction, and an orthogonal projection of the conductor portion onto the base substrate overlaps an orthogonal projection of a second portion of a previous subpixel of the subpixel to which the conductor portion belongs in the first direction onto the substrate.

In a possible embodiment of the present disclosure, each subpixel further includes a data line, at least a part of the data line extends in a second direction intersecting the first direction, the subpixel driving circuitry further includes a first conductive connection member, the first conductive connection member extends along the second direction, an orthogonal projection of the second electrode of the first transistor onto the base substrate overlaps an orthogonal projection of a first end of the first conductive connection member onto the base substrate at a first overlapping region, the second electrode of the first transistor is coupled to the first end of the first conductive connection member at the first overlapping region, a second end of the first conductive connection member is coupled to the gate electrode of the driving transistor, and the orthogonal projection of the first portion onto the base substrate is located between an orthogonal projection of the first overlapping region onto the base substrate and an orthogonal projection of the data line onto the base substrate.

In a possible embodiment of the present disclosure, each subpixel further includes a data line, and at least a part of the data line extends in a second direction intersecting the first direction. The subpixel driving circuitry further includes a data write-in transistor, a gate electrode of which is coupled to the gate line, a first electrode of which is coupled to the data line, and a second electrode of which is coupled to the first electrode of the driving transistor. The orthogonal projection of the second portion onto the base substrate overlaps an orthogonal projection of the first electrode of the data write-in transistor onto the base substrate, and the orthogonal projection of the second portion onto the base substrate overlaps an orthogonal projection of the data line onto the base substrate.

In a possible embodiment of the present disclosure, the orthogonal projection of the data line onto the base substrate is located between an orthogonal projection of a channel portion of the data write-in transistor onto the base substrate and the orthogonal projection of the conductor portion of the first transistor of a next subpixel onto the base substrate.

In a possible embodiment of the present disclosure, each subpixel further includes a data line, and at least a part of the data line extends in a second direction intersecting the first direction. The subpixel driving circuitry further includes: a second conductive connection member, at least a part of the second conductive connection member extending along the second direction; a second transistor, a gate electrode of which is coupled to a resetting signal line, a first electrode of which is coupled to an initialization signal line, and a second electrode of which is coupled to the second electrode of the first transistor; and a seventh transistor, a gate electrode of which is coupled to a resetting signal line of a next subpixel in the second direction, and a first electrode of which is coupled to an initialization signal line of the next subpixel in the second direction, and a second electrode of which is coupled to an anode of a corresponding light-emitting element. An orthogonal projection of a channel portion of the second transistor onto the base substrate is located between the orthogonal projection of the data line onto the base substrate and an orthogonal projection of the second conductive connection member onto the base substrate, and an orthogonal projection of a channel portion of the seventh transistor onto the base substrate is located between the orthogonal projection of the second conductive connection member coupled to the seventh transistor onto the base substrate and an orthogonal projection of the data line of a previous subpixel of the subpixel to which the seventh transistor belongs in the first direction onto the base substrate.

In a possible embodiment of the present disclosure, each subpixel further includes a data line, and at least a part of the data line extends in a second direction intersecting the first direction. The subpixel driving circuitry further includes: a fifth transistor, a gate electrode of which is coupled to a light-emission control signal line, a first electrode of which is coupled to the power source signal line, and a second electrode of which is coupled to the first electrode of the driving transistor; and a sixth transistor, a gate electrode of which is coupled to the light-emission control signal line, a first electrode of which is coupled to the second electrode of the driving transistor, and a second electrode of which is coupled to an anode of a light-emitting element. An orthogonal projection of a channel portion of the fifth transistor onto the base substrate is located between the orthogonal projection of the data line onto the base substrate and an orthogonal projection of the power source signal line onto the base substrate, and an orthogonal projection of a channel portion of the sixth transistor onto the base substrate is located between the orthogonal projection of the second conductive connection member coupled to the sixth transistor onto the base substrate and an orthogonal projection of the data line of a previous subpixel of the subpixel to which the sixth transistor belongs in the first direction onto the base substrate.

In a possible embodiment of the present disclosure, each subpixel further includes a data line, at least a part of the data line extends in a second direction intersecting the first direction, an orthogonal projection of the first electrode of the driving transistor onto the base substrate is located between an orthogonal projection of the gate electrode of the driving transistor onto the base substrate and the orthogonal projection of the data line onto the base substrate, and an orthogonal projection of the second electrode of the driving transistor onto the base substrate is located between the orthogonal projection of the gate electrode of the driving transistor onto the base substrate and an orthogonal projection of the data line of a previous subpixel of the subpixel to which the driving transistor belongs in the first direction onto the base substrate.

In a possible embodiment of the present disclosure, the subpixel driving circuitry further includes a storage capacitor, a first electrode plate of the storage capacitor is coupled to the gate electrode of the driving transistor, a second electrode plate of the storage capacitor is coupled to the power source signal line, and the voltage stabilizing electrode and the second electrode plate of the storage capacitor are arranged at a same layer and made of a same material.

In a possible embodiment of the present disclosure, each subpixel further includes: a data line, at least a part of the data line extending in a second direction intersecting the first direction; and a power source signal line. At least a part of the power source signal line extends in the second direction, an orthogonal projection of the second electrode plate of the storage capacitor onto the base substrate overlaps the orthogonal projection of the power source signal line onto the base substrate at a second overlapping region where the second electrode of the storage capacitor is coupled to the power source signal line, and the orthogonal projection of the data line onto the base substrate is located between an orthogonal projection of the first overlapping region onto the base substrate and an orthogonal projection of the gate electrode of the driving transistor of a next subpixel of the subpixel to which data line belongs in the first direction onto the base substrate.

In a possible embodiment of the present disclosure, the first subpixel includes a green subpixel.

In a possible embodiment of the present disclosure, the target subpixel includes a green subpixel.

In a possible embodiment of the present disclosure, the plurality of subpixels further includes red subpixels and blue subpixels.

In a possible embodiment of the present disclosure, each row of subpixels includes a plurality of groups of subpixels arranged along the first direction, and each group of subpixels includes red subpixels, green subpixels, blue subpixels, and green subpixels cyclically arranged along the first direction.

In a possible embodiment of the present disclosure, in each row of subpixels along the first direction, a subpixel closest to the first boundary is the green subpixel.

In a possible embodiment of the present disclosure, the subpixel driving circuitry includes: a first transistor, a gate electrode of which is coupled to the gate line; a second transistor, a gate electrode of which is coupled to a resetting signal line, a first electrode of which is coupled to an initialization signal line, and a second electrode of which is coupled to the second electrode of the first transistor; a data write-in transistor, a gate electrode of which is coupled to the gate line, a first electrode of which is coupled to the data line, and a second electrode of which is coupled to the first electrode of the driving transistor; a fifth transistor, a gate electrode of the which is coupled to a light-emission control signal line, a first electrode of which is coupled to the power source signal line, and a second electrode of which is coupled to the first electrode of the driving transistor; a sixth transistor, a gate electrode of which is coupled to the light-emission control signal line, a first electrode of which is coupled to the second electrode of the driving transistor, and a second electrode of which is coupled to an anode of a light-emitting element; a seventh transistor, a gate electrode of which is coupled to a resetting signal line of a next subpixel in the second direction, and a first electrode of which is coupled to an initialization signal line of the next subpixel in the second direction, and a second electrode of which is coupled to the anode of the corresponding light-emitting element; and a storage capacitor, a first electrode plate of which is coupled to the gate electrode of the driving transistor, and a second electrode plate of which is coupled to the power source signal line.

In another aspect, the present disclosure provides in some embodiments a display device, including the above-mentioned display substrate.

In yet another aspect, the present disclosure provides in some embodiments a method for manufacturing a display substrate, including forming a plurality of subpixels arranged in an array form on a base substrate. The plurality of subpixels is arranged in rows, and each row of subpixels includes a plurality of subpixels arranged in sequence along a first direction. Each subpixel includes a voltage stabilizing electrode, and a subpixel driving circuitry. The subpixel driving circuitry includes a driving transistor and a first transistor, a first electrode of the first transistor is coupled to a second electrode of the driving transistor, a second electrode of the first transistor is coupled to a gate electrode of the driving transistor, and an active layer of the first transistor includes a first semiconductor portion and a second semiconductor portion spaced apart from each other, and a conductor portion coupled to the first semiconductor portion and the second semiconductor portion. An orthogonal projection of the conductor portion onto the base substrate overlaps an orthogonal projection of the second portion of a previous subpixel of the subpixel to which the conductor portion belongs in the first direction onto the base substrate. Each row of subpixels includes a plurality of first subpixels, the plurality of first subpixels includes target subpixels, and each target subpixel is arranged closest to a first boundary of the display substrate in the row of subpixels.

In a possible embodiment of the present disclosure, the subpixel driving circuitry includes a storage capacitor, a first electrode plate of the storage capacitor is coupled to the gate electrode of the driving transistor, and a second electrode plate of the storage capacitor is coupled to the power source signal line. The forming the plurality of subpixels arranged in an array form on the base substrate includes forming the voltage stabilizing electrode and the second electrode plate of the storage capacitor simultaneously through a single patterning process.

According to the embodiments of the present disclosure, the active layer of the first transistor may include the first semiconductor portion and the second semiconductor portion spaced apart from each other, and the conductor portion coupled to the first semiconductor portion and the second semiconductor portion. The orthogonal projection of the conductor portion onto the base substrate may overlap the orthogonal projection of the voltage stabilizing electrode of the previous subpixel of the subpixel to which the semiconductor portion belongs in the first direction onto the base substrate. Hence, the voltage stabilizing electrode and the conductor portion may form a voltage stabilizing capacitor. When on and off states of the first transistor change, it is able for the voltage stabilizing capacitor to stabilize a voltage of the first transistor, thereby to improve the brightness uniformity of the subpixels of the display panel.

DETAILED DESCRIPTION

The present disclosure provides in some embodiments a display substrate, which includes a base substrate and a plurality of subpixels arranged in an array form on the base substrate. The plurality of subpixels is arranged in rows, and each row of subpixels includes N subpixels arranged in sequence along a first direction, where N is a positive integer.

Each subpixel may include a subpixel driving circuitry.

Figure 1:
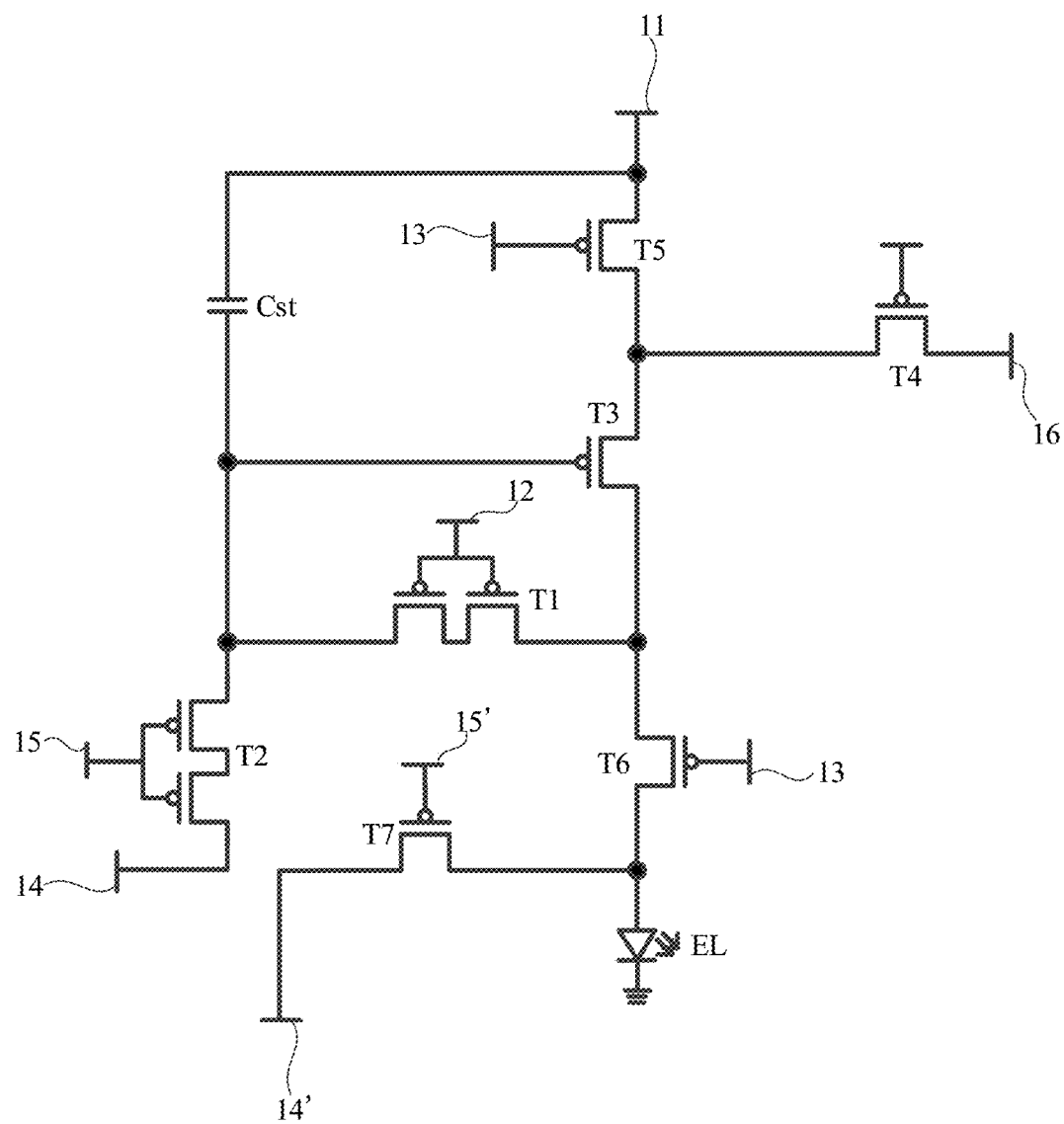
FIG. 1 is a circuit diagram of a subpixel driving circuitry according to one embodiment of the present disclosure.

As shown in FIG. 1, the subpixel driving circuitry may include a driving transistor T3 and a first transistor T1, a first electrode of the first transistor T1 may be coupled to a second electrode of the driving transistor T3, and a second electrode of the first transistor T1 may be coupled to a gate electrode of the driving transistor T3.

Figure 2A:
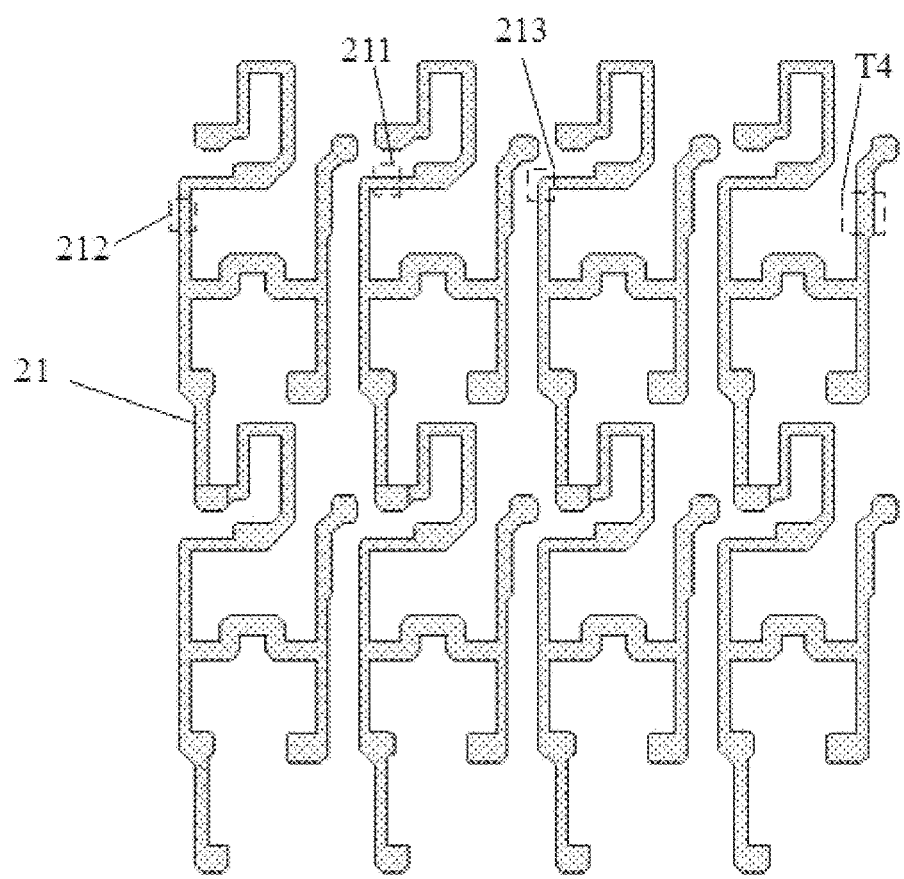
FIG. 2A is a schematic view showing an intermediate manufacturing process of a display substrate according to one embodiment of the present disclosure.
Figure 2B:
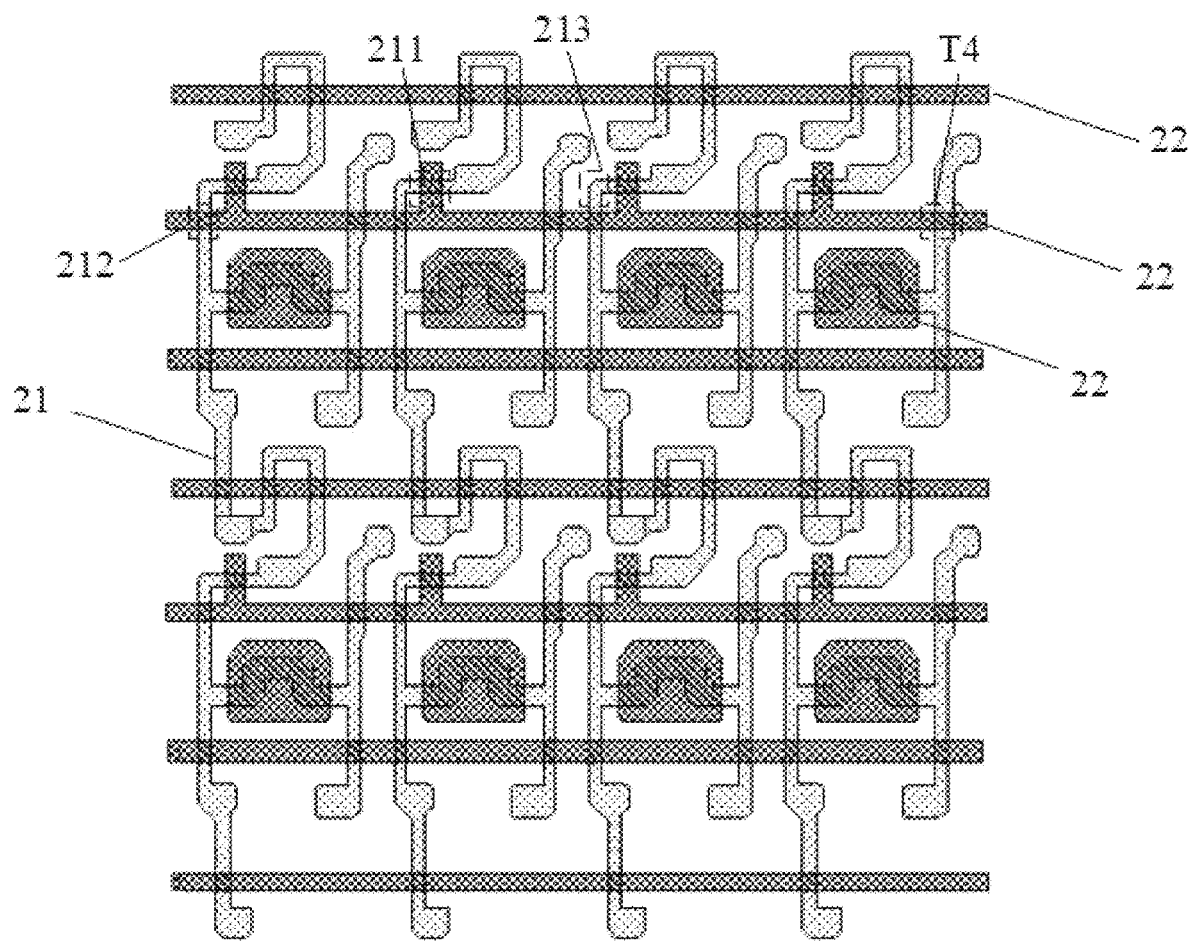
FIG. 2B is another schematic view showing the intermediate manufacturing process of the display substrate according to one embodiment of the present disclosure.
Figure 2C:
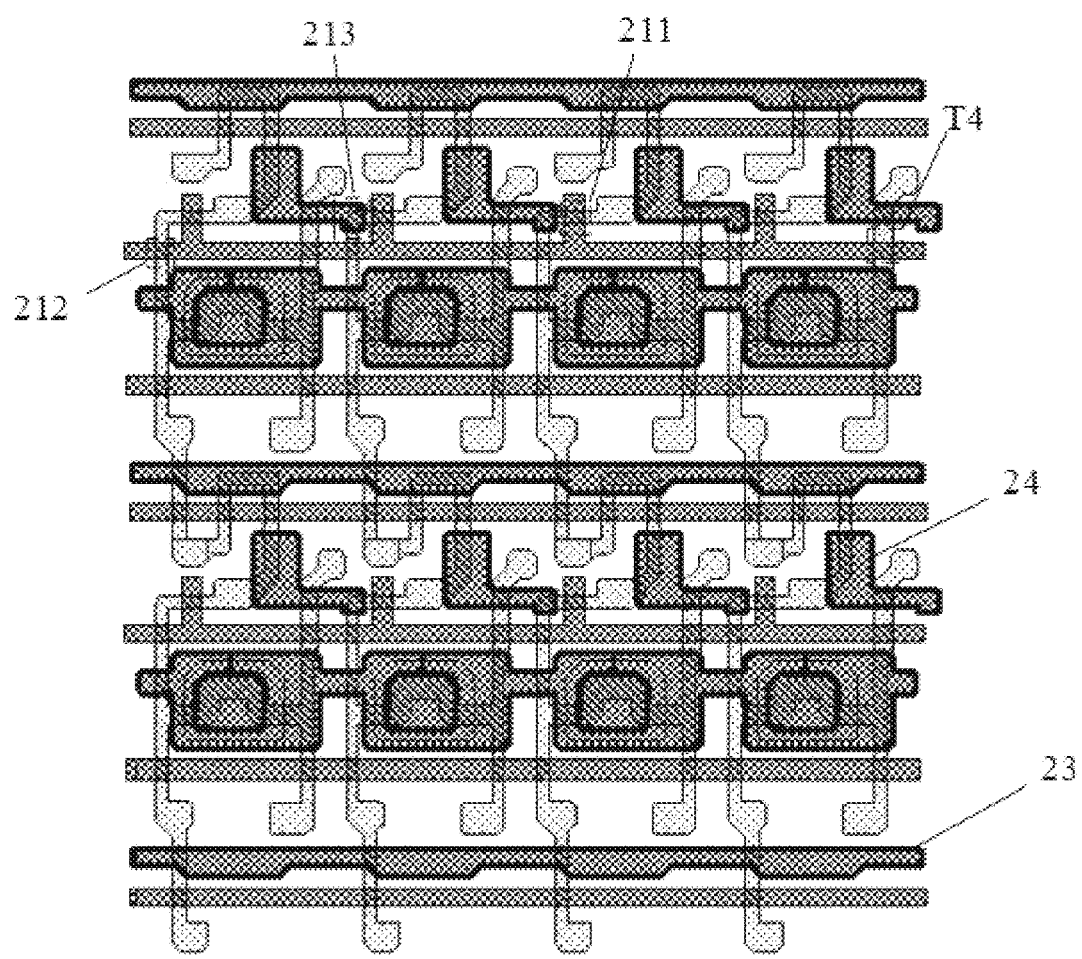
FIG. 2C is yet another schematic view showing the intermediate manufacturing process of the display substrate according to one embodiment of the present disclosure.

As shown in FIGS. 2A to 2C, an active layer of the first transistor T1 may include a first semiconductor portion 211 and a second semiconductor portion 212 spaced apart from each other, and a conductor portion 213 coupled to the first semiconductor portion 211 and the second semiconductor portion 212.

Each of first to $(N-1)^{th}$ subpixels along the first direction may further include a voltage stabilizing electrode, each row of subpixels may include a plurality of first subpixels, the first subpixels of $N^{th}$ subpixels in the first direction may be target subpixels, the target subpixel in the row of subpixels may be arranged closest to a first boundary of the display substrate, and an orthogonal projection of the conductor portion of the first transistor of the target subpixel onto the base substrate may overlap an orthogonal projection of the voltage stabilizing electrode of the $(N-1)^{th}$ subpixel in the row onto the base substrate.

As shown in FIG. 2C, an orthogonal projection of the conductor portion 213 onto the base substrate may overlap an orthogonal projection of the voltage stabilizing electrode of a previous subpixel of the subpixel to which the conductor portion belongs in the first direction onto the base substrate.

In the embodiments of the present disclosure, for the subpixels of the display substrate, the first transistor T1 of each subpixel at the boundary of the display substrate may be more sensitive to a voltage change, so the scheme in the embodiments of the present disclosure is more suitable for the subpixels arranged closest to the boundary of the display substrate.

In the embodiments of the present disclosure, when the orthogonal projection of the voltage stabilizing electrode 24 onto the base substrate overlaps the orthogonal projection of the conductor portion 213 onto the base substrate, the voltage stabilizing electrode 24 and the conductor portion 213 may be electrode plates of a capacitor respectively, and they may form a voltage stabilizing capacitor. When on and off states of the first transistor T1 change, it is able for the voltage stabilizing capacitor to stabilize a voltage of the first transistor T1, thereby to improve the brightness uniformity of the subpixels of the display substrate.

Figure 2D:
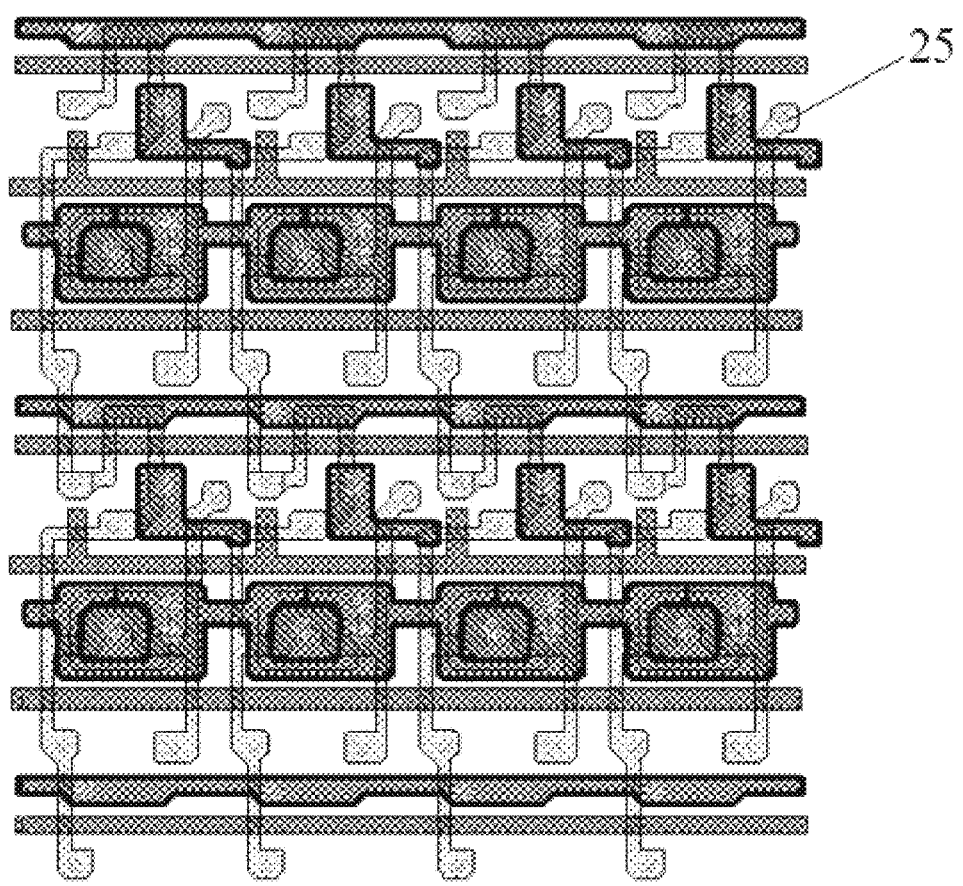
FIG. 2D is still yet another schematic view showing the intermediate manufacturing process of the display substrate according to one embodiment of the present disclosure.
Figure 2E:
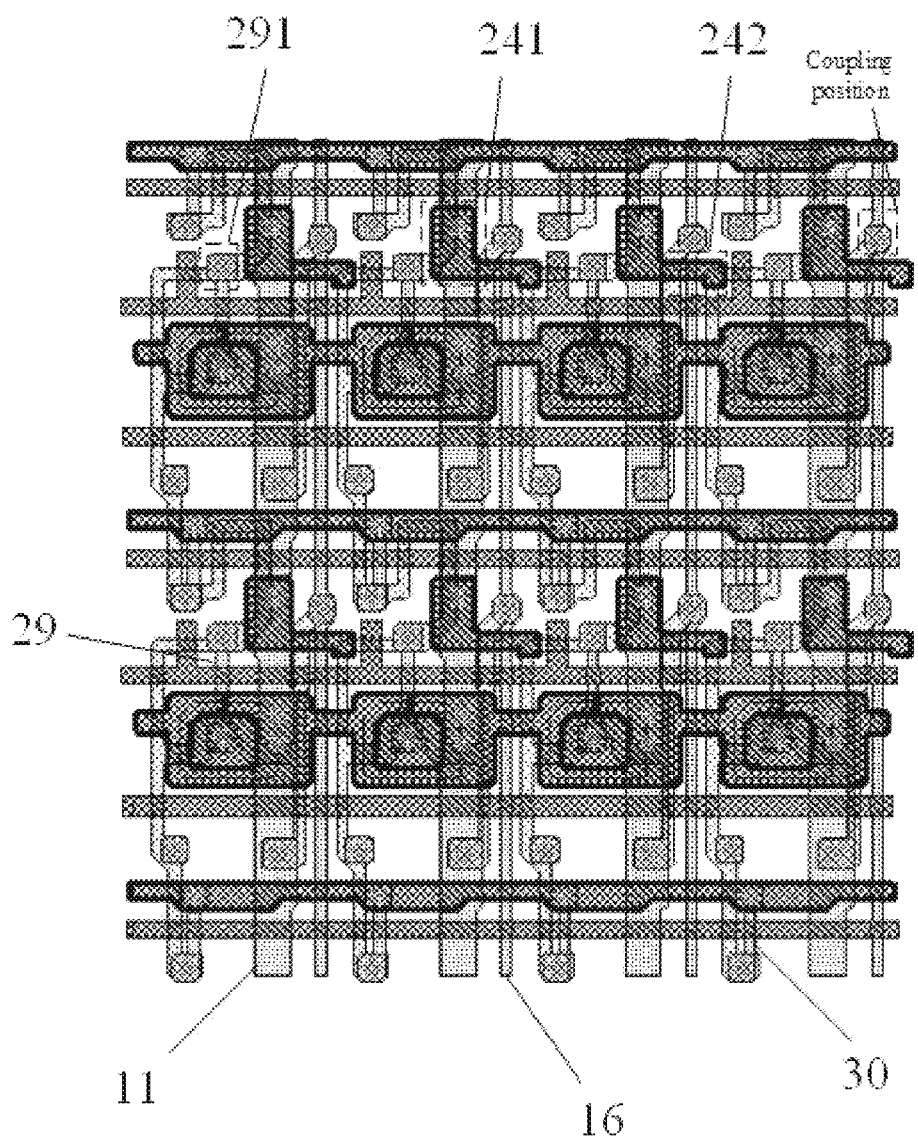
FIG. 2E is still yet another schematic view showing the intermediate manufacturing process of the display substrate according to one embodiment of the present disclosure.

In some embodiments of the present disclosure, as shown in FIG. 2E, each subpixel may further include a power source signal line 11, at least a part of the power source signal line 11 may extend in a second direction, and the voltage stabilizing electrode 24 may be coupled to the power source signal line 11. The first direction refers to a lateral direction in FIGS. 2A to 2G, and the second direction refers to a longitudinal direction in FIGS. 2A to 2G.

The voltage stabilizing electrode 24 may be coupled to the power source signal line 11 to apply a stable voltage to the voltage stabilizing electrode 24 through the power source signal line 11. In this way, when the voltage stabilizing electrode 24 and the conductor portion 213 form a capacitor, it is able to stabilize the voltage of the first transistor T1.

Figure 3:
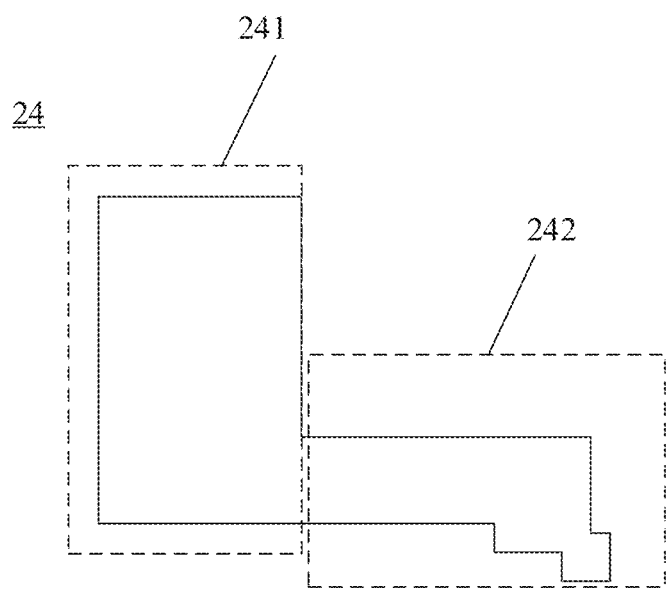
FIG. 3 is a schematic view showing a voltage stabilizing electrode of the display substrate according to one embodiment of the present disclosure.

In some embodiments of the present disclosure, as shown in FIG. 3, the voltage stabilizing electrode 24 may include a first portion 241 and a second portion 242 coupled to each other, an orthogonal projection of the first portion 241 onto the base substrate may overlap an orthogonal projection of the power source signal line 11 onto the base substrate at an overlapping region where the first portion 241 is coupled to the power source signal line 11, and at least a part of the second portion 242 may extend along the first direction.

As shown in FIGS. 2C and 2D, the orthogonal projection of the conductor portion 213 onto the base substrate may overlap an orthogonal projection of the second portion 242 of a previous subpixel of the subpixel to which the conductor portion belongs in the first direction onto the base substrate.

As shown in FIG. 3, the voltage stabilizing electrode 24 in the embodiments of the present disclosure may be approximately L-shaped. As shown in FIG. 2C, through controlling an extension position and an extension direction of an end portion, the voltage stabilizing electrode 24 may overlap the conductor portion 213 of the next subpixel in the first direction to form a voltage stabilizing capacitor for stabilizing the voltage.

In some embodiments of the present disclosure, as shown in FIG. 2E, each subpixel may further include a data line 16, and at least a part of the data line 16 may extend in a second direction intersecting the first direction.

As shown in FIG. 2E, the subpixel driving circuitry may further include a first conductive connection member 29 extending along the second direction. For example, the second direction may be the longitudinal direction shown in FIG. 1.

As shown in FIG. 2E, an orthogonal projection of the second electrode of the first transistor T1 onto the base substrate may overlap an orthogonal projection of a first end of the first conductive connection member 29 onto the base substrate at a first overlapping region 291 where the second electrode of the first transistor T1 is coupled to the first end of the first conductive connection member 29, and a second end of the first conductive connection member 29 may be coupled to the gate electrode of the driving transistor T3.

Referring to FIGS. 2E and 3, the orthogonal projection of the first portion 241 onto the base substrate may be located between an orthogonal projection of the first overlapping region 291 onto the base substrate and an orthogonal projection of the data line 16 onto the base substrate.

A potential at the gate electrode of the driving transistor may be affected by a signal jump across the data line 16, and brightness of a pixel may be affected by the stability of the potential at the gate electrode. When the orthogonal projection of the first portion 241 onto the base substrate is located between the orthogonal projection of the first overlapping region 291 onto the base substrate and the orthogonal projection of the data line 16 onto the base substrate, it is able to improve the stability of the potential at the gate electrode of the driving transistor T3.

In some embodiments of the present disclosure, each subpixel may further include a data line 16, and at least a part of the data line 16 may extend in a second direction intersecting the first direction.

The subpixel driving circuitry may further include a data write-in transistor T4, a gate electrode of which is coupled to the gate line 12, a first electrode of which is coupled to the data line 16, and a second electrode of which is coupled to the first electrode of the driving transistor T3.

Referring to FIGS. 2E and 3 again, the orthogonal projection of the second portion 242 onto the base substrate may overlap an orthogonal projection of the first electrode of the data write-in transistor T4 onto the base substrate, and the orthogonal projection of the second portion 242 onto the base substrate may overlap the orthogonal projection of the data line 16 onto the base substrate.

In some embodiments of the present disclosure, the orthogonal projection of the data line 16 onto the base substrate may be located between an orthogonal projection of a channel portion of the data write-in transistor T4 onto the base substrate and an orthogonal projection of the conductor portion of the first transistor T1 of a next subpixel onto the base substrate.

In some embodiments of the present disclosure, as shown in FIG. 2E, each subpixel may further include a data line 16, and at least a part of the data line 16 may extend in a second direction intersecting the first direction.

The subpixel driving circuitry may further include a second conductive connection member 30, a second transistor T2 and a seventh transistor T7, and at least a part of the second conductive connection member 30 may extend along the second direction.

As shown in FIG. 1, a gate electrode of the second transistor T2 may be coupled to a resetting signal line 15, a first electrode of the second transistor T2 may be coupled to an initialization signal line 14, and a second electrode of the second transistor T2 may be coupled to the second electrode of the first transistor T1.

A gate electrode of the seventh transistor T7 may be coupled to a resetting signal line 15' of a next subpixel in the second direction, and a first electrode of the seventh transistor T7 may be coupled to an initialization signal line 14' of the next subpixel along the second direction, and a second electrode of the seventh transistor T7 may be coupled to an anode 27 of a corresponding light-emitting element EL.

As shown in FIG. 2E, an orthogonal projection of a channel portion of the second transistor T2 onto the base substrate may be located between the orthogonal projection of the data line 16 onto the base substrate and an orthogonal projection of the second conductive connection member 30 onto the base substrate.

Referring to FIG. 2E again, an orthogonal projection of a channel portion of the seventh transistor T7 onto the base substrate may be located between the orthogonal projection of the second conductive connection member 30 coupled to the seventh transistor onto the base substrate and the orthogonal projection of the data line 16 of a previous subpixel of the subpixel to which the seventh transistor belongs in the first direction onto the base substrate.

In some embodiments of the present disclosure, each subpixel may further include a data line 16, and at least a part of the data line 16 may extend in the second direction intersecting the first direction.

The subpixel driving circuitry may further include a fifth transistor T5 and a sixth transistor T6, a gate electrode of the fifth transistor T5 may be coupled to a light-emission control signal line 13, a first electrode of the fifth transistor T5 may be coupled to the power source signal line 11, and a second electrode of the fifth transistor T5 may be coupled to the first electrode of the driving transistor T3.

A gate electrode of the sixth transistor T6 may be coupled to the light-emission control signal line 13, a first electrode of the sixth transistor T6 may be coupled to the second electrode of the driving transistor T3, and a second electrode of the sixth transistor T6 may be coupled to an anode 27 of a light-emitting element EL.

An orthogonal projection of a channel portion of the fifth transistor T5 onto the base substrate may be located between the orthogonal projection of the data line 16 onto the base substrate and the orthogonal projection of the power source signal line 11 onto the base substrate.

An orthogonal projection of a channel portion of the sixth transistor T6 onto the base substrate may be located between the orthogonal projection of the second conductive connection member 30 coupled to the sixth transistor onto the base substrate and the orthogonal projection of the data line 16 of a previous subpixel of the subpixel to which the sixth transistor belongs in the first direction onto the base substrate.

In some embodiments of the present disclosure, each subpixel may further include a data line 16, and at least a part of the data line 16 may extends in a second direction intersecting the first direction.

An orthogonal projection of the first electrode of the driving transistor T3 onto the base substrate may be located between an orthogonal projection of the gate electrode of the driving transistor T3 onto the base substrate and the orthogonal projection of the data line 16 onto the base substrate, and an orthogonal projection of the second electrode of the driving transistor T3 onto the base substrate may be located between the orthogonal projection of the gate electrode of the driving transistor T3 onto the base substrate and the orthogonal projection of the data line 16 of a previous subpixel of the subpixel to which the driving transistor belongs in the first direction onto the base substrate.

In some embodiments of the present disclosure, the subpixel driving circuitry may further include a storage capacitor Cst, a first electrode plate of the storage capacitor Cst may be coupled to the gate electrode of the driving transistor T3, a second electrode plate of the storage capacitor Cst may be coupled to the power source signal line 11, and the voltage stabilizing electrode 24 and the second electrode plate of the storage capacitor Cst may be arranged at a same layer and made of a same material.

In this regard, the voltage stabilizing electrode 24 and the storage capacitor Cst may be formed through a single patterning process, so as to reduce the quantity of processes as well as the manufacture cost.

In some embodiments of the present disclosure, each subpixel may further include a data line 16 and a power source signal line 11. At least a part of the data line 16 may extend in a second direction intersecting the first direction. At least a part of the power source signal line 11 may extend in the second direction.

An orthogonal projection of the second electrode plate of the storage capacitor Cst onto the base substrate may overlap an orthogonal projection of the power source signal line 11 onto the base substrate at a second overlapping region where the second electrode plate of the storage capacitor Cst is coupled to the power source signal line, and the orthogonal projection of the data line 16 onto the base substrate may be located between an orthogonal projection of the first overlapping region onto the base substrate and the orthogonal projection of the gate electrode of the driving transistor T3 of a next subpixel of the subpixel to which the data line belongs in the first direction onto the base substrate.

In some embodiments of the present disclosure, the first subpixel may include a green subpixel G.

In some embodiments of the present disclosure, the target subpixel may include a green subpixel G.

It should be appreciated that, the first transistor T1 of the green subpixel G may be more sensitive to the voltage change, so in the embodiments of the present disclosure, mainly the green subpixel G may be compensated.

In some embodiments of the present disclosure, the plurality of subpixels may further include red subpixels and blue subpixels.

In some embodiments of the present disclosure, each row of subpixels may include a plurality of groups of subpixels arranged along the first direction, and each group of subpixels may include red subpixels R, green subpixels G, blue subpixels B, and green subpixels G that are cyclically arranged along the first direction.

In some embodiments of the present disclosure, in each row of subpixels along the first direction, a subpixel closest to the first boundary may be the green subpixel G.

Figure 2F:
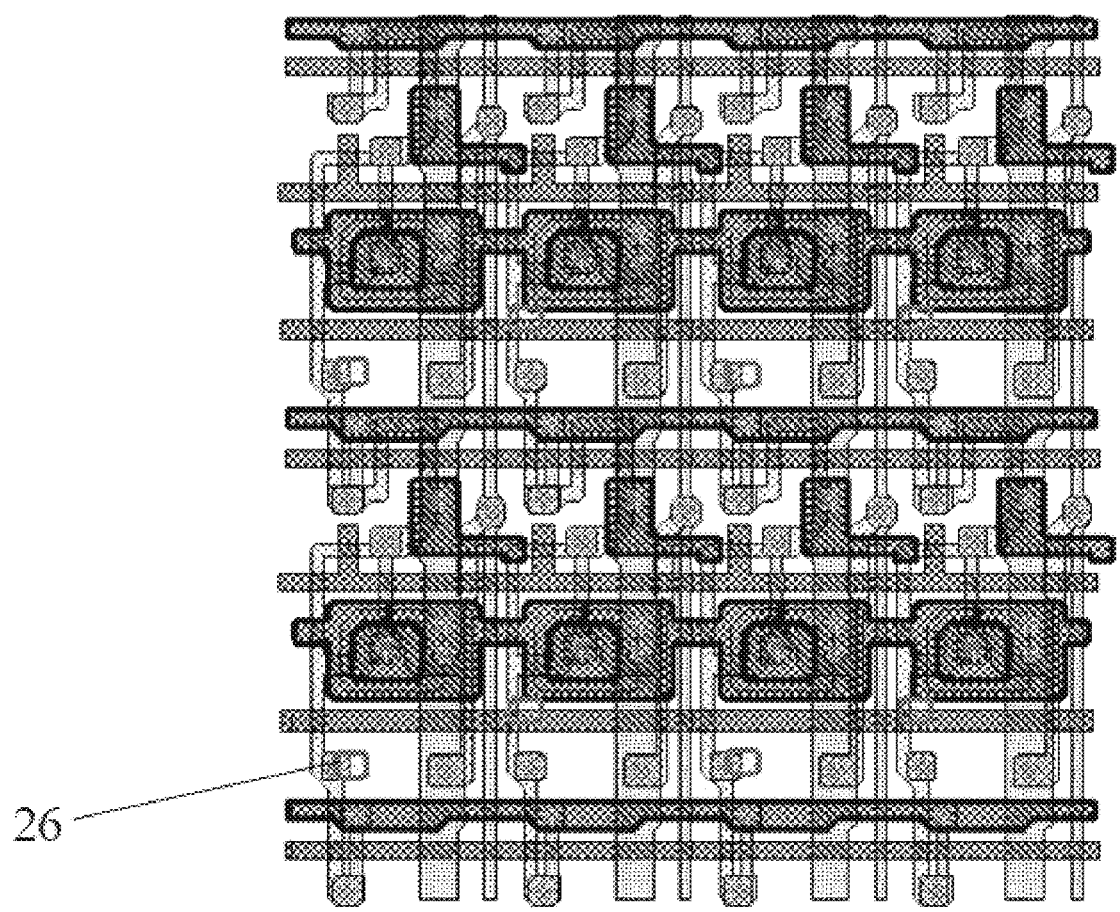
FIG. 2F is still yet another schematic view showing the intermediate manufacturing process of the display substrate according to one embodiment of the present disclosure.
Figure 2G:
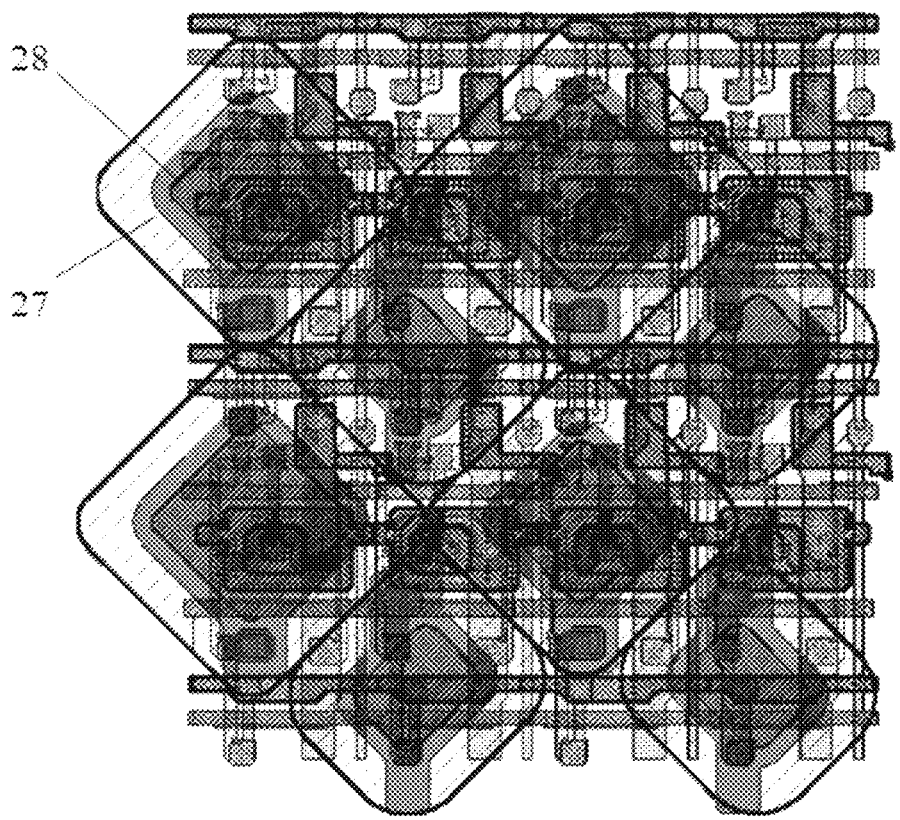
FIG. 2G is still yet another schematic view showing the intermediate manufacturing process of the display substrate according to one embodiment of the present disclosure.

As shown in FIG. 2G, in the embodiments of the present disclosure, the subpixels in different colors may be arranged in a diamond shape. It should be appreciated that, in each row, the red subpixel R, the green subpixel G, the blue subpixel B, and the green subpixel G may be arranged sequentially. For example, a subpixel at an initial position may be a red subpixel R or a blue subpixel B, so that the subpixel at the end may be a green subpixel G. In other words, in each row of subpixels, all the subpixels close to one side of the boundary may be red subpixels R or blue subpixels, and all the subpixels close to the other side of the boundary may be green subpixels G. The first boundary may be a boundary where the green subpixels G are located.

As shown in FIG. 1, in a possible embodiment of the present disclosure, the subpixel driving circuitry may include: a first transistor T1, a gate electrode of which is coupled to the gate line 12; a second transistor T2, a gate electrode of which is coupled to the resetting signal line 15, a first electrode of which is coupled to the initialization signal line 14, and a second electrode of which is coupled to a second electrode of the first transistor T1; a driving transistor T3; a data write-in transistor T4, a gate electrode of which is coupled to the gate line 12, a first electrode of which is coupled to the data line 16, and a second electrode of which is coupled to a first electrode of the driving transistor T3; a fifth transistor T5, a gate electrode of which is coupled to the light-emission control signal line 13, a first electrode of which is coupled to the power source signal line 11, and a second electrode of which is coupled to the first electrode of the driving transistor T3; a sixth transistor T6, a gate electrode of which is coupled to the light-emission control signal line 13, a first electrode of which is coupled to a second electrode of the driving transistor T3, and a second electrode of which is coupled to an anode 27 of a light-emitting element EL; a seventh transistor T7, a gate electrode of which is coupled to the resetting signal line 15' of a next subpixel in the second direction, and a first electrode of which is coupled to the initialization signal line 14' of the next subpixel along the second direction, and a second electrode of which is coupled to the anode 27 of the corresponding light-emitting element EL; and a storage capacitor Cst, a first electrode plate of which is coupled to a gate electrode of the driving transistor T3, and a second electrode plate of which is coupled to the power source signal line 11.

The present disclosure further provides in some embodiments a display device including the above-mentioned display substrate.

The display device includes the above-mentioned display substrate, so it is able for the display device to achieve at least the above-mentioned technical effect, which will not be particularly defined herein.

The present disclosure further provides in some embodiments a method for manufacturing a display substrate, which includes forming a plurality of subpixels arranged in an array form on a base substrate.

During the manufacture, as shown in FIG. 2A, an active layer 21 may be formed onto the base substrate at first. Next, as shown in FIG. 2B, a first gate layer 22 may be formed. Next, as shown in FIG. 2C, a second gate layer 23 and the voltage stabilizing electrode 24 may be formed. Next, as shown in FIG. 2D, an interlayer dielectric layer 25 may be formed. Next, as shown in FIG. 2E, a source/drain electrode layer, including the power source signal line 11 and the data line 16, may be formed. Next, as shown in FIG. 2F, a PLN via hole 26 may be formed. Finally, as shown in FIG. 2G, the anode 27 of the light-emitting element EL and a pixel definition layer 28 may be formed.

The manufactured display substrate may be that mentioned hereinabove, and thus will not be particularly defined herein.

In some embodiments of the present disclosure, the subpixel driving circuitry may further include a storage capacitor Cst, a first electrode plate of which is coupled to the gate electrode of the driving transistor T3, and a second electrode plate of which is coupled to the power source signal line 11. The forming the plurality of subpixels arranged in an array form onto the base substrate may include forming the voltage stabilizing electrode and the second electrode plate of the storage capacitor simultaneously through a single patterning process.

In the embodiments of the present disclosure, the voltage stabilizing electrode 24 and the second electrode plate of the storage capacitor Cst may be formed through a single patterning process, so as to reduce the quantity of processes as well as the manufacture cost.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate and a plurality of subpixels arranged in an array form on the base substrate, wherein the plurality of subpixels is arranged in rows, and each row of subpixels comprises N subpixels arranged in sequence along a first direction, where N is a positive integer;

each subpixel comprises a subpixel driving circuitry, the subpixel driving circuitry comprises a driving transistor and a first transistor, a first electrode of the first transistor is coupled to a second electrode of the driving transistor, a second electrode of the first transistor is coupled to a gate electrode of the driving transistor, and an active layer of the first transistor comprises a first semiconductor portion and a second semiconductor portion spaced apart from each other, and a conductor portion coupled to the first semiconductor portion and the second semiconductor portion;

wherein each subpixel further comprises a power source signal line, at least a part of the power source signal line extends in a second direction, and a voltage stabilizing electrode is coupled to the power source signal line; and the voltage stabilizing electrode comprises a first portion and a second portion coupled to each other, an orthogonal projection of the first portion onto the base substrate overlaps an orthogonal projection of the power source signal line onto the base substrate at an overlapping region where the first portion is coupled to the power source signal line, at least a part of the second portion extends along the first direction to a next subpixel in the first direction, and an orthogonal projection of the conductor portion onto the base substrate overlaps an orthogonal projection of a second portion of a voltage stabilizing electrode of a previous subpixel of the subpixel to which the conductor portion belongs in the first direction onto the substrate; and the voltage stabilizing electrode is L-shaped, wherein each subpixel further comprises a data line, and at least a part of the data line extends in a second direction intersecting the first direction, wherein the subpixel driving circuitry further comprises a data write-in transistor, a gate electrode of which is coupled to the gate line, a first electrode of which is coupled to the data line, and a second electrode of which is coupled to the first electrode of the driving transistor, wherein the orthogonal projection of the second portion onto the base substrate overlaps an orthogonal projection of the first electrode of the data write-in transistor onto the base substrate, and the orthogonal projection of the second portion onto the base substrate overlaps an orthogonal projection of the data line onto the base substrate, and the orthogonal projection of the second portion onto the base substrate is between an orthogonal projection of the first transistor onto the base substrate and an orthogonal projection of a coupling position of the first electrode of the data write-in transistor and the data line, the plurality of subpixels arranged in rows comprises red subpixels, blue subpixels and green subpixels, and are arranged in a diamond shape, in each row, a red subpixel, a green subpixel, a blue subpixel, and a green subpixel are arranged sequentially, in the first direction, subpixels at a first column are the red subpixels or the blue subpixels, subpixels at last column are the green subpixels, the first boundary is a boundary where the green subpixels are located, the voltage stabilizing electrodes stabilize subpixel driving circuitries of other subpixels except red subpixels or blue subpixels in the first column;

wherein a second portion of a voltage stabilizing electrode in the last column only occludes a first electrode of a data write-in transistor of a subpixel driving circuitry in the last column, and a second portion of a voltage stabilizing electrode in remaining columns obscures a first electrode of a data write-in transistor of a subpixel driving circuitry in its own column and a conductor portion of a first transistor of a subpixel driving circuitry in its next column;

the first electrode of the data write-in transistor is integrated in the active layer of the first transistor.

2. The display substrate according to claim 1, wherein the subpixel driving circuitry further comprises a first conductive connection member, the first conductive connection member extends along the second direction, an orthogonal projection of the second electrode of the first transistor onto the base substrate overlaps an orthogonal projection of a first end of the first conductive connection member onto the base substrate at a first overlapping region, the second electrode of the first transistor is coupled to the first end of the first conductive connection member at the first overlapping region, a second end of the first conductive connection member is coupled to the gate electrode of the driving transistor, and the orthogonal projection of the first portion onto the base substrate is located between an orthogonal projection of the first overlapping region onto the base substrate and an orthogonal projection of the data line onto the base substrate.

3. The display substrate according to claim 2, wherein the subpixel driving circuitry further comprises a storage capacitor, a first electrode plate of the storage capacitor is coupled to the gate electrode of the driving transistor, a second electrode plate of the storage capacitor is coupled to the power source signal line, and the voltage stabilizing electrode and the second electrode plate of the storage capacitor are arranged at a same layer and made of a same material.

4. The display substrate according to claim 3, wherein each subpixel further comprises a power source signal line, wherein at least a part of the power source signal line extending in the second direction, an orthogonal projection of the second electrode plate of the storage capacitor onto the base substrate overlaps the orthogonal projection of the power source signal line onto the base substrate at a second overlapping region where the second electrode of the storage capacitor is coupled to the power source signal line, and the orthogonal projection of the data line onto the base substrate is located between an orthogonal projection of the first overlapping region onto the base substrate and an orthogonal projection of the gate electrode of the driving transistor of a next subpixel of the subpixel to which data line belongs in the first direction onto the base substrate.

5. The display substrate according to claim 1, wherein the orthogonal projection of the data line onto the base substrate is located between an orthogonal projection of a channel portion of the data write-in transistor onto the base substrate and the orthogonal projection of the conductor portion of the first transistor of a next subpixel onto the base substrate.

6. The display substrate according to claim 1, wherein the subpixel driving circuitry further comprises: a second conductive connection member, at least a part of the second conductive connection member extending along the second direction; a second transistor, a gate electrode of which is coupled to a resetting signal line, a first electrode of which is coupled to an initialization signal line, and a second electrode of which is coupled to the second electrode of the first transistor; and a seventh transistor, a gate electrode of which is coupled to a resetting signal line of a next subpixel in the second direction, and a first electrode of which is coupled to an initialization signal line of the next subpixel in the second direction, and a second electrode of which is coupled to an anode of a corresponding light-emitting element, wherein an orthogonal projection of a channel portion of the second transistor onto the base substrate is located between the orthogonal projection of the data line onto the base substrate and an orthogonal projection onto the base second conductive connection member onto the base substrate, and an orthogonal projection of a channel portion of the seventh transistor onto the base substrate is located between the orthogonal projection of the second conductive connection member coupled to the seventh transistor onto the base substrate and an orthogonal projection of the data line of a previous subpixel of the subpixel to which the seventh transistor belongs in the first direction onto the base substrate.

7. The display substrate according to claim 1, wherein the subpixel driving circuitry further comprises: a fifth transistor, a gate electrode of which is coupled to a light-emission control signal line, a first electrode of which is coupled to the power source signal line, and a second electrode of which is coupled to the first electrode of the driving transistor; and a sixth transistor, a gate electrode of which is coupled to the light-emission control signal line, a first electrode of which is coupled to the second electrode of the driving transistor, and a second electrode of which is coupled to an anode of a light-emitting element, wherein an orthogonal projection of a channel portion of the fifth transistor onto the base substrate is located between the orthogonal projection of the data line onto the base substrate and an orthogonal projection of the power source signal line onto the base substrate, and an orthogonal projection of a channel portion of the sixth transistor onto the base substrate is located between the orthogonal projection of the second conductive connection member coupled to the sixth transistor onto the base substrate and an orthogonal projection of the data line of a previous subpixel of the subpixel to which the sixth transistor belongs in the first direction onto the base substrate.

8. The display substrate according to claim 1, wherein an orthogonal projection of the first electrode of the driving transistor onto the base substrate is located between an orthogonal projection of the gate electrode of the driving transistor onto the base substrate and the orthogonal projection of the data line onto the base substrate, and an orthogonal projection of the second electrode of the driving transistor onto the base substrate is located between the orthogonal projection of the gate electrode of the driving transistor onto the base substrate and an orthogonal projection of the data line of a previous subpixel of the subpixel to which the driving transistor belongs in the first direction onto the base substrate.

9. The display substrate according to claim 1, wherein the subpixel driving circuitry comprises: the first transistor, a gate electrode of which is coupled to the gate line; a second transistor, a gate electrode of which is coupled to a resetting signal line, a first electrode of which is coupled to an initialization signal line, and a second electrode of which is coupled to the second electrode of the first transistor; a data write-in transistor, a gate electrode of which is coupled to the gate line, a first electrode of which is coupled to the data line, and a second electrode of which is coupled to the first electrode of the driving transistor; a fifth transistor, a gate electrode of the which is coupled to a light-emission control signal line, a first electrode of which is coupled to the power source signal line, and a second electrode of which is coupled to the first electrode of the driving transistor; a sixth transistor, a gate electrode of which is coupled to the light-emission control signal line, a first electrode of which is coupled to the second electrode of the driving transistor, and a second electrode of which is coupled to an anode of a light-emitting element; a seventh transistor, a gate electrode of which is coupled to a resetting signal line of a next subpixel in the second direction, and a first electrode of which is coupled to an initialization signal line of the next subpixel in the second direction, and a second electrode of which is coupled to the anode of the corresponding light-emitting element; and a storage capacitor, a first electrode plate of which is coupled to the gate electrode of the driving transistor, and a second electrode plate of which is coupled to the power source signal line.

10. The display substrate according to claim 1, wherein the orthogonal projection of the second portion onto the base substrate is between an orthogonal projection of the first transistor onto the base substrate and an orthogonal projection of a coupling position of the first electrode of the data write-in transistor and the data line comprises:

the orthogonal projection of the second portion onto the base substrate is between an orthogonal projection of a first transistor of a subpixel driving circuitry in (I+1)th column onto the base substrate and an orthogonal projection of a coupling position of a first electrode of a data write-in transistor of a subpixel driving circuitry in Ith column and the data line, wherein I is equal to or greater than 1, and I+1 is less than or equal to N.

11. A display device, comprising the display substrate according to claim 1.

12. A method for manufacturing a display substrate, comprising forming a plurality of subpixels arranged in an array form on a base substrate, wherein the plurality of subpixels is arranged in rows, and each row of subpixels comprises a plurality of subpixels arranged in sequence along a first direction;

each subpixel comprises a subpixel driving circuitry;

the subpixel driving circuitry comprises a driving transistor and a first transistor, a first electrode of the first transistor is coupled to a second electrode of the driving transistor, a second electrode of the first transistor is coupled to a gate electrode of the driving transistor, and an active layer of the first transistor comprises a first semiconductor portion and a second semiconductor portion spaced apart from each other, and a conductor portion coupled to the first semiconductor portion and the second semiconductor portion;

wherein each subpixel further comprises a power source signal line, at least a part of the power source signal line extends in a second direction, and a voltage stabilizing electrode is coupled to the power source signal line; and the voltage stabilizing electrode comprises a first portion and a second portion coupled to each other, an orthogonal projection of the first portion onto the base substrate overlaps an orthogonal projection of the power source signal line onto the base substrate at an overlapping region where the first portion is coupled to the power source signal line, at least a part of the second portion extends along the first direction to a next subpixel in the first direction, an orthogonal projection of the conductor portion onto the base substrate overlaps an orthogonal projection of the second portion of a previous subpixel of the subpixel to which the conductor portion belongs in the first direction onto the base substrate, and the voltage stabilizing electrode is L-shaped; and wherein each subpixel further comprises a data line, and at least a part of the data line extends in a second direction intersecting the first direction, wherein the subpixel driving circuitry further comprises a data write-in transistor, a gate electrode of which is coupled to the gate line, a first electrode of which is coupled to the data line, and a second electrode of which is coupled to the first electrode of the driving transistor, wherein the orthogonal projection of the second portion onto the base substrate overlaps an orthogonal projection of the first electrode of the data write-in transistor onto the base substrate, and the orthogonal projection of the second portion onto the base substrate overlaps an orthogonal projection of the data line onto the base substrate, and the orthogonal projection of the second portion onto the base substrate is between an orthogonal projection of the first transistor onto the base substrate and an orthogonal projection of a coupling position of the first electrode of the data write-in transistor and the data line, the plurality of subpixels arranged in rows comprises red subpixels, blue subpixels and green subpixels, and are arranged in a diamond shape, in each row, a red subpixel, a green subpixel, a blue subpixel, and a green subpixel are arranged sequentially, in the first direction, subpixels at a first column are the red subpixels or the blue subpixels, subpixels at last column are the green subpixels, the first boundary is a boundary where the green subpixels are located, the voltage stabilizing electrodes stabilize subpixel driving circuitries of other subpixels except red subpixels or blue subpixels in the first column;

wherein a second portion of a voltage stabilizing electrode in the last column only occludes a first electrode of a data write-in transistor of a subpixel driving circuitry in the last column, and a second portion of a voltage stabilizing electrode in remaining columns obscures a first electrode of a data write-in transistor of a subpixel driving circuitry in its own column and a conductor portion of a first transistor of a subpixel driving circuitry in its next column;

the first electrode of the data write-in transistor is integrated in the active layer of the first transistor.

13. The method according to claim 12, wherein the subpixel driving circuitry comprises a storage capacitor, and a first electrode plate of the storage capacitor is coupled to the gate electrode of the driving transistor, and a second electrode plate of the storage capacitor is coupled to the power source signal line, wherein the forming the plurality of subpixels arranged in an array form on the base substrate comprises forming the voltage stabilizing electrode and the second electrode plate of the storage capacitor simultaneously through a single patterning process.

14. The method according to claim 12, wherein the subpixel driving circuitry further comprises a storage capacitor, a first electrode plate of the storage capacitor is coupled to the gate electrode of the driving transistor, a second electrode plate of the storage capacitor is coupled to the power source signal line, and the voltage stabilizing electrode and the second electrode plate of the storage capacitor are arranged at a same layer and made of a same material.

15. The method according to claim 12, wherein the orthogonal projection of the data line onto the base substrate is located between an orthogonal projection of a channel portion of the data write-in transistor onto the base substrate and the orthogonal projection of the conductor portion of the first transistor of a next subpixel onto the base substrate.

16. The method according to claim 12, wherein the orthogonal projection of the second portion onto the base substrate is between an orthogonal projection of the first transistor onto the base substrate and an orthogonal projection of a coupling position of the first electrode of the data write-in transistor and the data line comprises:

the orthogonal projection of the second portion onto the base substrate is between an orthogonal projection of a first transistor of a subpixel driving circuitry in (I+1)th column onto the base substrate and an orthogonal projection of a coupling position of a first electrode of a data write-in transistor of a subpixel driving circuitry in Ith column and the data line, wherein I is equal to or greater than 1, and I+1 is less than or equal to N.

* * * * *